(12) United States Patent
Yoon

(10) Patent No.: US 6,566,932 B2
(45) Date of Patent: May 20, 2003

(54) ON-CHIP SYSTEM WITH VOLTAGE LEVEL CONVERTING DEVICE FOR PREVENTING LEAKAGE CURRENT DUE TO VOLTAGE LEVEL DIFFERENCE

(75) Inventor: Seong-Ho Yoon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/040,341

(22) Filed: Nov. 1, 2001

(65) Prior Publication Data

US 2002/0153934 A1 Oct. 24, 2002

(30) Foreign Application Priority Data

Apr. 18, 2001 (KR) .......................................... 2001-20768

(51) Int. Cl.[7] .......................................... H03K 19/0185
(52) U.S. Cl. .......................... 327/333; 326/83; 326/81; 326/62
(58) Field of Search ................................. 327/306, 333, 327/437; 326/80, 81, 82, 83, 62, 63

(56) References Cited

U.S. PATENT DOCUMENTS

| 5,422,862 A | 6/1995 | Wisor ........................... 368/10 |
| 5,818,847 A | 10/1998 | Zak ............................. 371/5.1 |
| 5,834,948 A | * 11/1998 | Yoshizaki et al. ............. 326/81 |
| 5,860,125 A | 1/1999 | Reents ........................ 711/166 |
| 6,043,699 A | * 3/2000 | Shimizu ...................... 327/333 |
| 6,064,226 A | * 5/2000 | Eart ............................ 327/333 |
| 6,067,631 A | 5/2000 | Choi ........................... 713/500 |

* cited by examiner

Primary Examiner—Dinh T Le
(74) Attorney, Agent, or Firm—Mills & Onello LLP

(57) ABSTRACT

A first module is operated at a first power supply voltage and is blocked from the first power supply voltage in a power-off mode. A second module is operated at a second power supply voltage higher than the first power supply voltage and is supplied with the second voltage even in the power-off mode. An interface circuit is connected between the first and second modules. The interface circuit includes a voltage level converting circuit having an input control circuit. The input control circuit allows the voltage level converting circuit to carry out a normal voltage converting operation in a normal operating mode, while interrupting a leakage current path of the voltage level converting circuit due to an input signal in an unstable status in the power-off mode.

22 Claims, 6 Drawing Sheets

US 6,566,932 B2

ON-CHIP SYSTEM WITH VOLTAGE LEVEL CONVERTING DEVICE FOR PREVENTING LEAKAGE CURRENT DUE TO VOLTAGE LEVEL DIFFERENCE

This application relies for priority upon Korean Patent Application No. 2001-20768, filed on Apr. 18, 2001, the contents of which are herein incorporated by reference in their entirety.

FIELD OF THE INVENTION

The present invention generally relates to a voltage level converting device, and more specifically to an on-chip system having a voltage level converting device serving to convert voltages between modules operating with different operating voltages.

BACKGROUND OF THE INVENTION

In system design, realizing a system having multi-functions with low power consumption is an important concern with respect to mobility and multi-functions in system. Accordingly, it is important to lower the power supply voltage. Moreover, the power supply voltages have been separated such that they can be individually supplied, depending on various functions of internal blocks. For the purpose of achieving low power consumption in the system, it is desired that the constituent parts thereof be designed to reduce the power in accordance with an operating mode and be configurted in an architecture minimizing the power consumption. To reduce the power consumption according to the operating modes, a power-down mode and power-off mode are provided for the system having central processing unit (CPU), real time clock circuit, clock control circuit, memory control circuit, etc.

If the system enters the power-down mode, only the CPU in the system operates. At that time, the clock is not supplied for the rest of the functional blocks or modules, thereby reducing dynamic current due to the clock. Accordingly, the power consumed can be reduced. Further, if the system enters the power-off mode, the power supply voltage is interrupted in blocks or modules when the system is not in use, except in required blocks.

In case that the power supply voltage is separated between modules and is different for each module in the system, a leakage current can be generated due to differences in the power supply voltage level for a signal transferred between the modules. For instance, it is assumed that a signal is transferred from a first module operating in a voltage of 2.5V to a second module operating in a voltage of 3.0V, and a well-known complementary metal oxide semiconductor (CMOS) inverter is used as the input or reception circuit for the second module. If the transmission signal is at a high level, a N-channel MOS transistor can be completely turned on. However, the P-channel MOS transistor where gate voltage is 2.5V and source voltage is 3.0V is not completely turned off. Hence, a small amount of leakage current flows from the power supply voltage to ground voltage through the PMOS and NMOS transistors.

To prevent the leakage current caused by the voltage level difference, the system employs voltage level converting circuit generally referred to as a "level shifter". A well-known voltage level converting circuit in this field is shown in FIG. 1. Referring to FIG. 1, the voltage level converting circuit as an interface circuit between the modules converts a voltage level of an input signal IN transferred from a 2.5V module to a 3.0V module. Two inverters INV1 and INV2, two PMOS transistors MP1 and MP2, and two NMOS transistors MN1 and MN2 compose the circuit. As indicated in dashed line, the inverter INV1 operates in the operating voltage VDD1 of the 2.5V module, and the rest of the components operate in the 3.0V module.

It is assumed that the power supply voltage of the first module is interrupted in the power-off mode, while the power supply voltage of the second module continues to be supplied in the power-off mode. The voltage level converting circuit shown in FIG. 1 has a problem when the system enters the power-off mode. That is, the leakage current flows within the voltage level converting circuit in the power-off mode, which results in harm to the low power structure of the system.

Specifically, when the system enters the power-off mode, the power supply voltage of the module generating the input signal IN is interrupted. Thus, the input signal IN and a reversed input signal nIN are conducted to be floating status, so that the signals have unstable values. Because of the bistable characteristic of the voltage level converting circuit, nodes N1 and N2 try to retain current stable voltage level. However, a lot of leakage current can be generated at a critical point as the signals IN and nIN are changed to be unstable. For instance, in the case that the signals IN and nIN turn to voltage level of logic '1', the nodes N1 and N2 turn to logic '0', and the PMOS transistors MP1 and MP2 are turned on. Since the NMOS transistors MN1 and MN2 are turned on, a lot of leakage current flows from the power supply voltage VDD2 to the ground voltage.

SUMMARY OF THE INVENTION

It is, therefore, an object of the present invention to provide an improved voltage level converting circuit applicable to low power consumption.

It is another object of the present invention to provide a voltage level converting circuit for effectively preventing internal leakage current caused by an input signal in unstable status.

It is further another object of the present invention to provide an on-chip system employing a voltage level converting circuit capable of preventing leakage current generated when a power supply voltage of a transmitting module is interrupted.

In order to attain the above objects, according to an aspect of the present invention, there is provided an interface circuit which serves to convert voltage level between modules. The interface circuit includes a voltage level converting circuit referred to as a "level shifter". According to a preferred embodiment of the invention, the voltage level converting circuit includes an input control circuit allowing the voltage level converting circuit to operate a normal voltage converting operation in a normal operating mode while preventing a leakage current path of the voltage level converting circuit due to an unstable input signal in a power-off mode.

According to another embodiment of the invention, the voltage level converting circuit includes a current path cut-off circuit which allows the voltage level converting circuit to operate the normal voltage converting operation in the normal operating mode, like the input control circuit. Meanwhile, in the power-off mode, the current path cut-off circuit interrupts a ground path of the voltage level converting circuit in order to prevent a leakage current path of the voltage level converting circuit due to an unstable input signal.

In accordance with the present invention, there is provided an on-chip system. The system includes a first module operated at a first power supply voltage and blocked from the first power supply voltage in a power-off mode. A second module is operated at a second power supply voltage and is supplied with a second power supply voltage even in the power-off mode. An interface circuit is connected between the fist module and the second module. The interface circuit includes a level converting section having input transistors for converting a voltage level of the first power supply voltage provided from the first module to a voltage level of the second power supply voltage. The interface circuit also includes means for preventing the input transistors from being synchronously activated in response to a control signal when a signal provided from the first module is unstable in the power-off mode.

In one embodiment, the control signal is at a high level in a normal operating mode and at a low level in the power-off mode. The control signal can be created in a control signal generating circuit which includes an output terminal of the first module and a resistor connected between the output terminal and ground voltage. The control signal can be provided from a connecting node of the resistor and the output terminal. The output terminal of the first module can be at a high level in the normal operating mode and in a floating status in the power-off mode.

In one embodiment, the means for preventing the input transistors from being synchronously activated includes a first inverter for converting a signal provided from the first module and a second inverter for converting the control signal. An OR gate provides a gate signal provided from one of the input transistors in response to the output signals from the first and second inverters. An AND gate provides a gate signal provided from another of the input transistors in response to the control signal and the signal provided from the first module. The first inverter can operate at the first power supply voltage and the second inverter, the OR gate and the AND gate can operate at the second power supply voltage.

In another aspect, the invention is directed to a voltage level converting device which includes an input terminal for receiving an input signal of a first power supply voltage. A pair of cross-coupled transistors is connected to a second supply voltage, a first node, and a second node. A first input transistor is connected between the first node and ground voltage, and a second input transistor is connected between the second node and ground voltage. An input control circuit prevents the first and second input transistors from being synchronously activated by an input signal in an unstable status in response to a control signal applied from the outside, when the input signal is in an unstable status.

In another aspect, the invention is directed to an on-chip system which includes a first module operated at a power supply voltage and blocked from the first power supply voltage in a power-off mode and a second module operated at a second power supply voltage higher than the first power supply voltage and supplied with the second power supply voltage even in the power-off mode. An interface circuit is connected between the first and second modules. The interface circuit includes a pair of cross-coupled transistors connected to the second power supply voltage, a first node and a second node. The first and second input transistors are connected between the first node and ground voltage and between the second node and the ground voltage. An input control circuit exclusively activates the first and second input transistors in response to a control signal applied from the outside when an input signal from the first module is in an unstable status in the power-off mode.

In another aspect, the invention is directed to an on-chip system which includes a first module operated at a first power supply voltage and blocked from the first power supply voltage in a power-off mode and a second module operated at a second power supply voltage higher that the first power supply voltage and supplied with the second power supply voltage even in the power-off mode. A plurality of voltage level converting circuits are serially connected between the first and second modules. Each of the voltage level converting circuits includes a pair of cross-coupled transistors connected to the second power supply voltage, a first node and a second node. The converting circuits also include first and second input transistors connected between the first node and a third node and between the second node and the third node, wherein the first input transistor is controlled by an input signal provided from the first module and the second input transistor is controlled by an inverted signal of the input signal. An inverter is connected to the first node for providing an output signal corresponding to the input signal. A current path cut-off circuit is connected between the third node and ground voltage to interrupt a current path between the third node and the ground voltage when an input signal of the respective level converting circuits is in an unstable status and the power-off mode.

In accordance with another aspect, the invention is directed to an on-chip system which includes a first module operated at a first power supply voltage and blocked from the first power supply voltage in a power-off mode and a second module operated at a second power supply voltage higher than the first power supply voltage and supplied with the second power supply voltage even in the power-off mode. A voltage level converting circuit is connected between the first and second modules. The voltage level converting circuit comprises a pair of cross-coupled transistors connected to the second power supply voltage, a first node and a second node. The converting circuit also includes first and second input transistors connected between the first node and the third node and between the second node and the third node, wherein the first input transistor is controlled by an input signal provided from the first module and the second input transistor is controlled by an inverted signal of the input signal. An AND gate receives a signal from the first node and control signal from the outside and provides an output signal corresponding to the input signal. A current path cut-off circuit is connected between the third node and ground voltage to interrupt a current path between the third node and the ground voltage when an input signal of the respective level converting circuits is in an unstable status and the power-off mode.

As is apparent from the foregoing, according to the circuit of the invention, it is possible to prevent the leakage current path of the voltage level converting circuit converting the voltage between modules being operated at different operating voltages.

BRIEF DESCRIPTION OF THE DRAWINGS

The above and other objects, features and advantages of the present invention will become more apparent from the following detailed description when taken in conjunction with the accompanying drawings.

DESCRIPTION OF PREFERRED EMBODIMENTS

A system of the present invention is constructed to effectively prevent (or reduce) leakage current in a voltage level converting circuit. For the purpose of removing the leakage current in the voltage level converting circuit itself, the circuit of the invention employs characteristics such as preventing an unstable voltage level for an input signal in a floating state from affecting a next stage in a power-off mode. Further, the leakage current path due to the input signal in the floating state in the power-off mode is completely blocked. Preferred embodiments for an on-chip system of the invention constructed by the foregoing characteristics will be in detail described hereinafter.

The on-chip system of the present invention is formed of various functional blocks or modules. To achieve the low power consumption in the system, the system provides a power-off mode and power-down mode. When the system enters the power-off mode, a power supply voltage for the blocks (or modules) except a required block (or module) is interrupted while the system is not used. One example of modules where the power supply voltage is continuously applied even in the power-off mode is a real-time clock (RTC) module, which is embedded in the on-chip system of the invention. The RTC module operates all the time to inform the system of the present time. Examples of RTC modules are disclosed in U.S. Pat. No. 5,422,862, entitled, "Computer System Employing An Improved Real Time Clock Alarm", U.S. Pat. No. 5,818, 847, entitled, "System and Method for Providing Real Time Values in Digital Data Processing System", U.S. Pat. No. 5,860,125, entitled, "Integrated Circuit Including a Real Time Clock, Configuration RAM, and Memory Controller in a Core Section Which Receives an Asynchronous Partial, Reset and An Asynchronously Master Reset", and U.S. Pat. No. 6,067,631, entitled. "Time setting Device And Method Of An Operating System in a Power Saving Mode".

Figure 1:
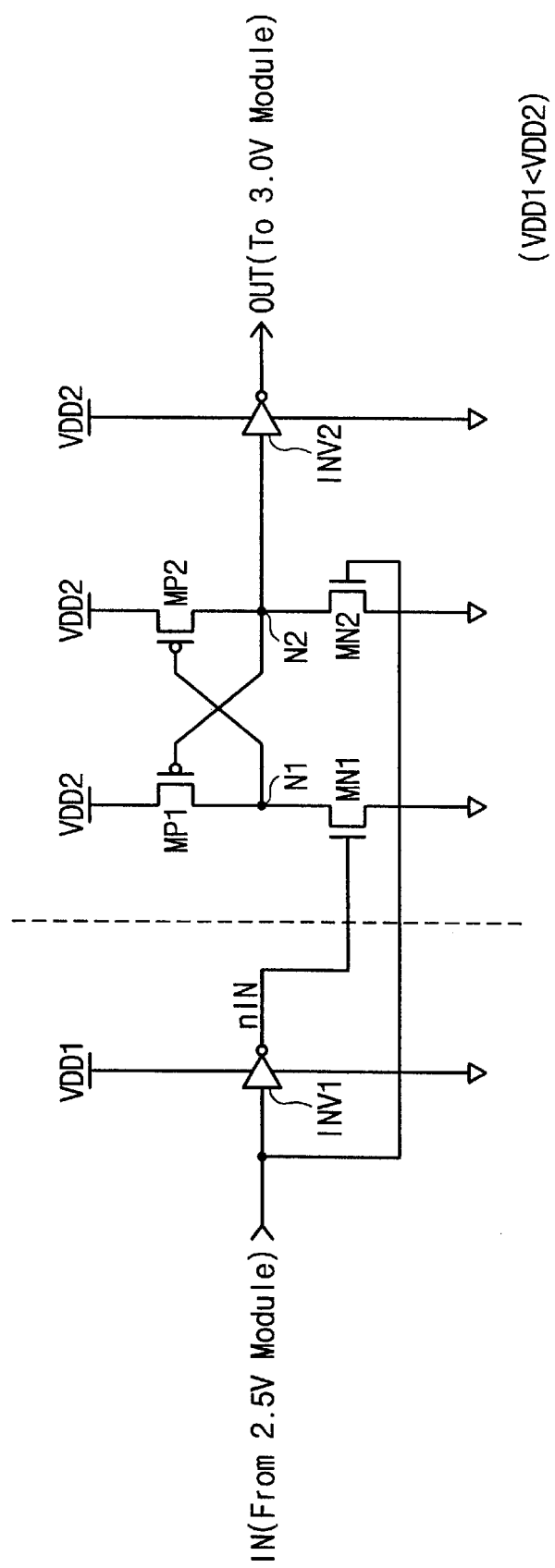
FIG. 1 is a circuit diagram showing a voltage level converting circuit according to the conventional art.
Figure 2:
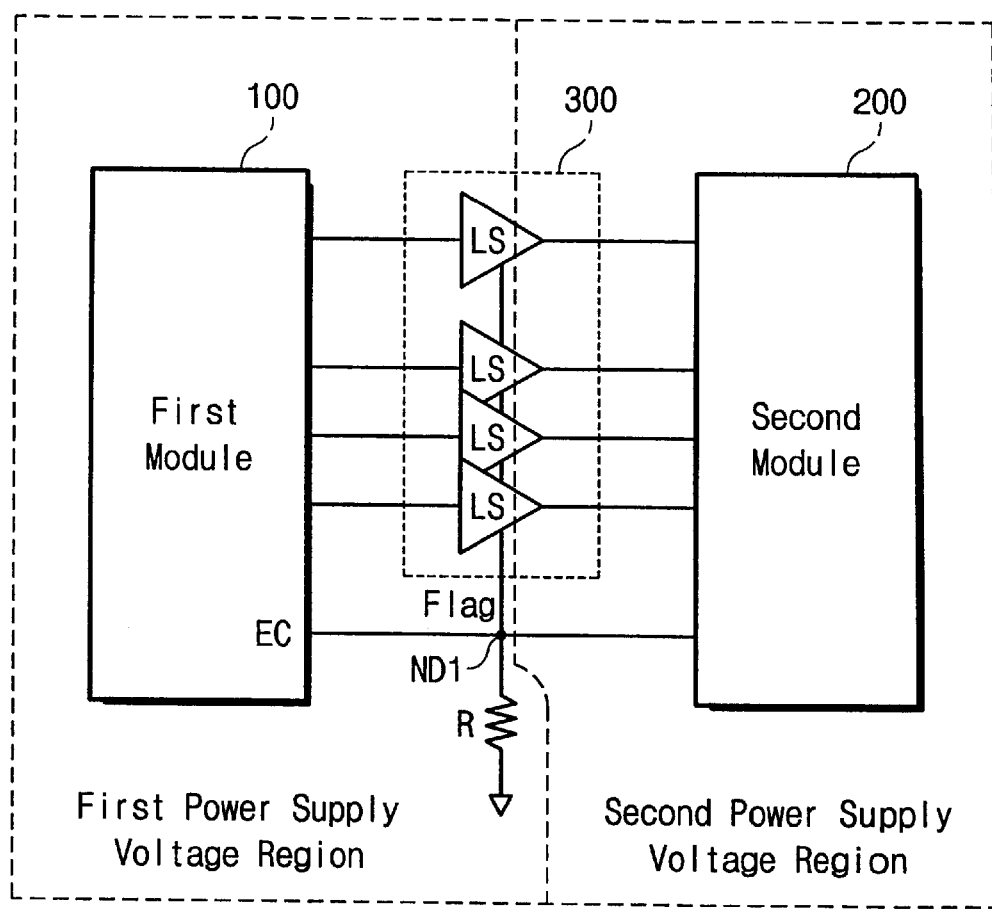
FIG. 2 is a block diagram showing an on-chip system according to a first embodiment of the present invention.

FIG. 2 shows an on-chip system employing an interface circuit 300 according to an embodiment of the invention. Referring to FIG. 2, the interface circuit 300 is connected between first and second modules 100 and 200. The first module 100 operates in a first power supply voltage VDD, and the second module 200 operates in a second power supply voltage RTCVDD which is higher than the first power supply voltage VDD. Here, as an example, the second module 300 is embodied in the aforementioned RTC module. In the power-off mode, the first power supply voltage VDD applied to the first module 100 is blocked, and the second power supply voltage RTCVDD applied to the second module 200 is continuously supplied. The first power supply voltage VDD is about 2.5V, and the second power supply voltage RTCVDD is about 3.0V as a battery voltage.

The interface circuit 300 converts a level of the first power supply voltage VDD transferred from the first module 100 to a level of the second power supply voltage RTCVDD in order to interrupt the leakage current caused by voltage level difference between modules. The interface circuit 300 is formed of a plurality of voltage level converting circuits LS or level shifters, and operated in accordance with a voltage on a node ND1 connected to an output terminal EC of the first module. A resistor R is connected between the node ND1 and ground voltage. The output terminal EC of the first module 100 has high level in the normal operating mode, and retains a floating state in the power-off mode. The first module 100 and the resistor R compose a control signal generating circuit for creating a control signal Flag representing the power-off mode. Thus, the control signal Flag has a high level in the normal mode and low level in the power-off mode.

Figure 3:
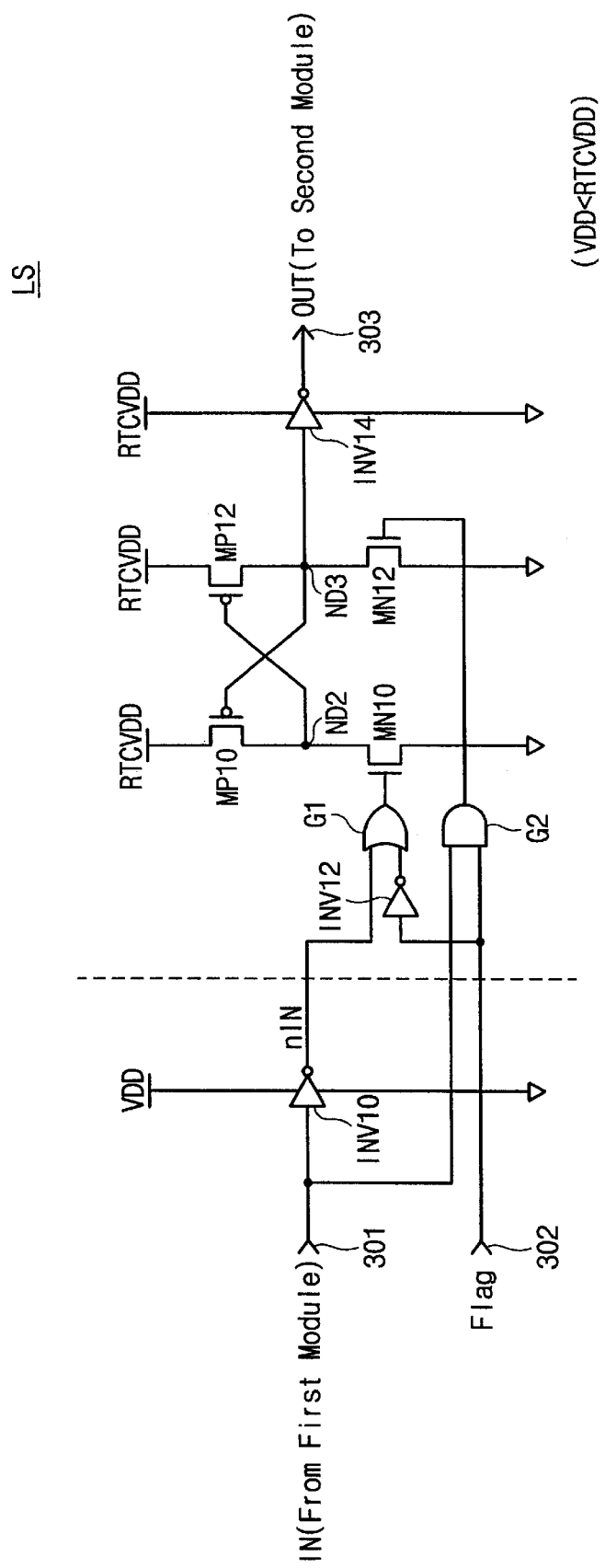
FIG. 3 is a circuit diagram showing an embodiment of a voltage level converting circuit shown in FIG. 2.

Referring to FIG. 3, each of the voltage level converting circuits LS is formed of three inverters INV10, INV12, and INV14, P-channel metal oxide semiconductor (PMOS) transistors MP10 and MP12, N-channel MOS transistors MN10 and MN12, OR gate G1, and AND gate G2. The inverter INV10 operates in the power supply voltage VDD of the first module 100, and inverters INV12 and INV14 operate in the power supply voltage RTCVDD of the second module 200. As described above, the power supply voltage VDD of the first module 100 is blocked in the power-off mode.

The inverter INV10, connected to an input terminal 301 of the interface circuit or voltage level converting circuit, converts input signal IN provided from the first module 100. The inverted input signal nIN is transferred to an input terminal of the OR gate G1. To the other input terminal of the OR gate G1 the control signal Flag is applied through the inverter INV12 connected to an input terminal 302. The control signal Flag has a high level in the normal operating mode, and a low level in the power-off mode. The AND gate G2 has input terminals respectively connected to the input terminals 301 and 302 receiving the input signal IN and the control signal Flag. The PMOS transistor MP10 has a current path formed between the power supply voltage RTCVDD of the second module 200 and a node ND2, and the PMOS transistor MP12 has a current path formed between the power supply voltage RTCVDD and a node ND3. Gate electrodes of the PMOS transistors MP10 and MP12 are cross-connected to the nodes ND2 and ND3. The NMOS transistor MN10 serving as input transistor has a current path formed between the node ND2 and the ground voltage, and a gate electrode coupled to a gate signal provided from the OR gate G1. The NMOS transistor MN12 serving as input transistor has a current path formed between the node ND3 and the ground voltage, and a gate electrode coupled to a gate signal provided from the AND gate G2. The inverter INV14, connected to the node ND3, provides an output signal OUT corresponding to the input signal IN through an output terminal 303.

When the input signal IN is at a high level having the power supply voltage VDD of the first module 100, the output signal OUT is at a high level having the power supply voltage RTCVDD of the second module. Meanwhile, if the input signal IN is at a high level having the power supply voltage VDD of the first module 100, it is possible to construct the voltage level converting circuit in which the output signal OUT has a low level having the ground voltage. Further, when the input signal IN is at a low level having the ground voltage of the first module 100, it is possible to construct the voltage level converting circuit in which the output signal OUT has a high level having the power supply voltage RTCVDD of the second module 200.

The inverters INV10 and INV12, the OR gate G1, and AND gate G2 compose an input control circuit for controlling the input transistors MN10 and MN12 in response to the input signal IN and the control signal Flag.

In the normal operating mode, the output terminal EC of the first module 100 has a high level as described above. The node ND1 rises up to a high level. Thus, the control signal Flag transitions to a high level in the normal operating mode. Due to the control signal Flag at a high level, output signals of the OR gate GI and the AND gate G2 are defined by the input signal IN applied to the input terminal 301. If the input signal IN at a high level is generated from the first module 100, the NMOS transistor MN10 is turned off and the NMOS transistor MN12 is turned on. Hence, the node ND3 is grounded, and the node ND2 is connected to the power supply voltage RTCVDD. As a result, the output signal OUT at a high level having the power supply voltage RTCVDD of the second module 200 is provided. On the contrary, if the input signal IN at a high level is provided from the first module 100, the output signal OUT is at a low level having the ground voltage of the second module 200. Thus, the voltage level converting circuit or interface circuit has the same operation in the normal mode with the voltage level converting circuit of the conventional art.

When the system employing the voltage level converting circuit in the present invention enters the power-off mode, the output terminal EC of the first module 100 is conducted to be in a floating state, and the node ND1 is grounded through pull-down resistor R. The control signal Flag transitions to a low level. At the same time, the power supply voltage VDD of the first module 100 is blocked, so that the input signal IN applied to the input terminal 301 and the output signal nIN of the inverter INV10 are in an unstable state. That is, it is possible for both the input signal IN applied to the input terminal 301 and the output signal nIN of the inverter INV10 to be at a high level. This causes leakage current to flow within the conventional voltage level converting circuit, and the unstable signal to be applied to a next stage of the voltage level converting circuit.

Since the control signal Flag is at a low level, output signals (or gate signals) provided from the OR gate G1 and the AND gate G2 are determined by the control signal Flag without regard to the input signal IN. The OR gate G1 generates a gate signal of a high level, and the AND gate G2 generates a gate signal of a low level. Thus, the NMOS transistor MN10 is turned on, and the NMOS transistor MN12 is turned off. Unlike the conventional voltage level converting circuit where the input transistors are synchronously turned on in the power-off mode, the unnecessary leakage current path between the power supply voltage RTCVDD and the ground voltage is not formed because of the NMOS transistor being turned on and the MN12 being turned off. According to the voltage level converting circuit or interface circuit of the invention, it is possible to provide a signal in a stable state for the next stage, as well as interrupting the leakage current within the voltage level converting circuit even in the power-off mode.

Figure 4:
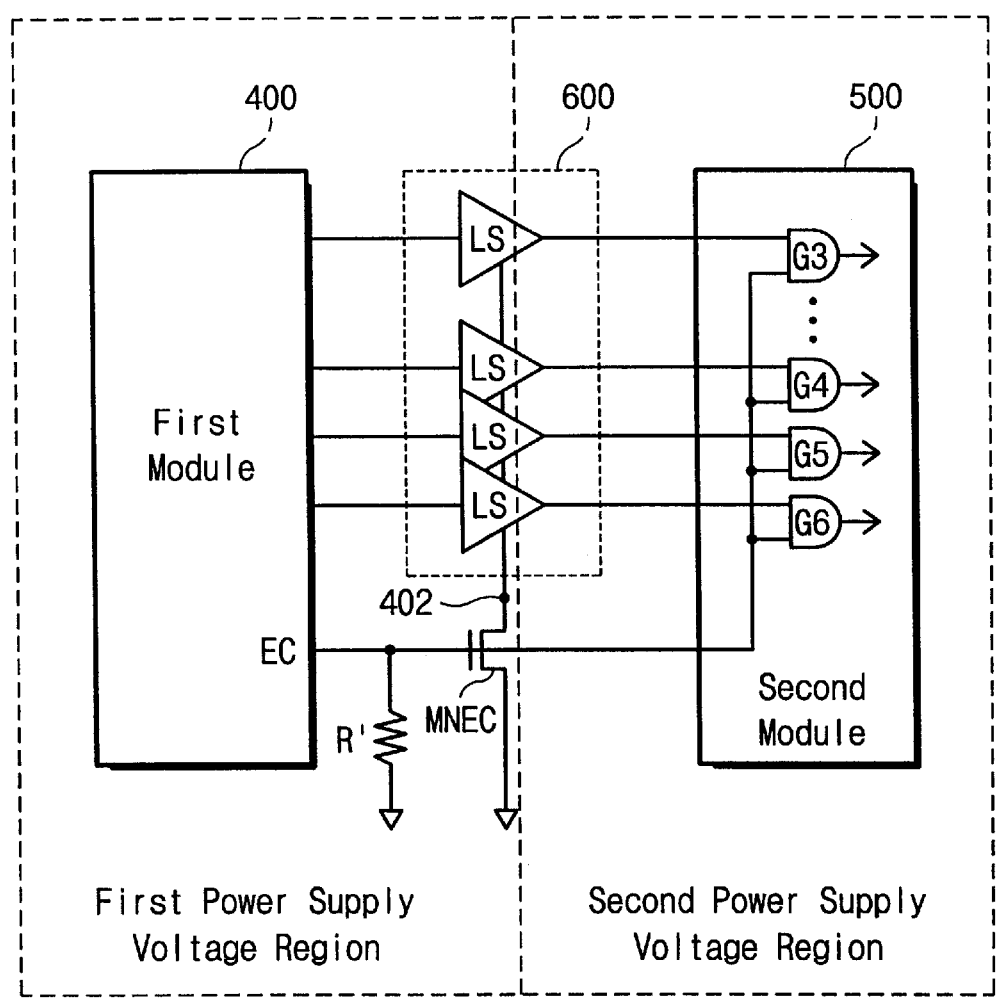
FIG. 4 is a block diagram showing an on-chip system according to a second embodiment of the present invention.

FIG. 4 is a block diagram showing an on-chip system according to a second embodiment of the present invention. Referring to FIG. 4, an interface circuit 600 is connected between a first module 400 and a second module 500 and is formed of a plurality of voltage level converting circuits LS. A power supply voltage applied to the first module 400 is blocked in the power-off mode, while a power supply voltage applied to the second module 500 is not blocked even in the power-off mode. The power supply voltage applied to the first module 400 is lower than the voltage applied to the second module 500. The second module 500 can be embodied in the aforementioned RTC circuit.

A ground path of the voltage level converting circuit LS in the interface circuit 600 is formed through NMOS transistor MNEC connected between a node 402 and the ground voltage. Thus, operation of the voltage level circuits LS depends on whether a current path of the NMOS transistor MNEC is formed. The NMOS transistor MNEC is turned on/off in accordance with voltage level of a connecting node of output terminal EC of the first module 400 and pull-down resistor R'. As the foregoing description of the previous embodiment, the output terminal EC of the first module 400 has high level in the normal operating mode, and floating state in the power-off mode. Hence, the NMOS transistor MNEC is turned on in the normal operating mode and turned off in the power-off mode due to the pull-down resistor R'. The pull-down resistor R' and the NMOS transistor MNEC serve as a current path cut-off circuit for interrupting a current path of the interface circuit 600.

Figure 5:
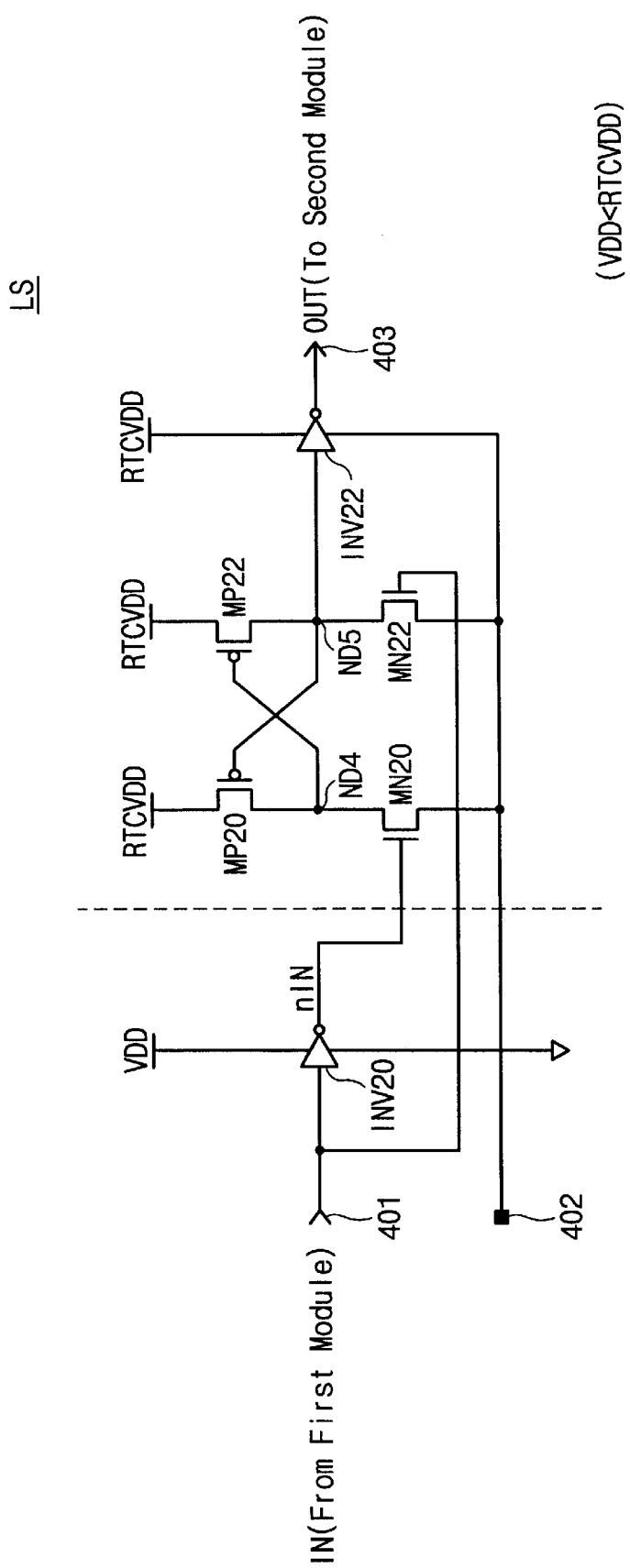
FIG. 5 is a circuit diagram showing an embodiment of a voltage level converting circuit shown in FIG. 4.

Referring to FIG. 5, each of the voltage level converting circuit LS includes inverters INV20 and INV22, two PMOS transistors MP20 and MP22, and two NMOS transistors MN20 and MN22. The inverter INV20 operates in power supply voltage VDD of the first module 400, and inverters INV22 operates in power supply voltage RTCVDD of the second module 500. The inverter INV20 is connected to an input terminal 401 and inverts an input signal IN applied to the input terminal 401. The PMOS transistor MP20 has a current path connected between the power supply voltage RTCVDD of the second module 500 and a node ND4, and the PMOS transistor MP22 has a current path connected between the power supply voltage RTCVDD of the second module 500 and a node ND5. Gate electrodes of the PMOS transistors MP20 and MP22 are cross-coupled to the nodes ND4 and ND5. The NMOS transistor MN20 has a current path formed between the node ND4 and a drain terminal of the NMOS transistor MNEC, i.e., node 402, and a gate electrode coupled to an output signal nIN of the inverter INV20. The NMOS transistor MN22 has a current path formed between the node ND5 and the drain terminal of the NMOS transistor MNEC, i.e., the node 402, and a gate electrode coupled to the input signal IN. The inverter INV22 is connected to the node ND5, and provides an output signal OUT corresponding to the input signal IN through an output terminal 403.

As shown in FIG. 5, the NMOS transistors MN20 and MN22, and inverter INV22 are connected to the node 402, not directly connected to the ground voltage. The node 402 is connected to the ground voltage through the NMOS transistor MNEC, as shown in FIG. 4. If the node 402 is conducted to be floating in the power-off mode, the output signal OUT of the voltage level converting circuit LS is subject to an unstable state, and likely affects the next stage. To prevent this, AND gates G3 through G6 corresponding to the voltage level converting circuits LS are provided for the second module 500. An input terminal of the respective AND gates G3~G6 is connected to the output terminal EC of the first module 400 and the connecting node of the pull-down resistor R'. Even though the output signal of the voltage level converting circuit LS in the power-off mode is in an unstable state, the AND gates G3~G6 provide a stable signal at a low level.

In the normal mode, the output terminal EC of the first module 400 has a high level, as described above. Briefly, the output terminal EC and the connecting node of the pull-down resistor R' are at high level. Thus, the NMOS transistor MNEC is turned on. In other words, a current path of the interface circuit 600 is formed, and the output signals of the AND gates G3~G6 are determined by the output signals of the voltage level converting circuits LS corresponding thereto. Each of the voltage level converting circuits LS converts a voltage level of the input signal IN to have the power supply voltage level of the second module 500, like the well-known level shifter. Thus, in the normal mode, the voltage level converting circuit operates similarly to the conventional voltage level converting circuit.

When the system employing the voltage level converting circuit of the present invention enters the power-off mode, the output terminal EC of the first module 400 is conducted to be in a floating state, and the gate electrode of the NMOS transistor MNEC is grounded through the pull-down resistor R'. Since the NMOS transistor MNEC is turned off, the ground paths of the voltage level converting circuits LS are blocked. Briefly, the leakage current path caused by the input signal IN at an unstable state is completely interrupted. As the ground path of the voltage level converting circuits LS is interrupted, even though the output signals of the interface circuit 600 are unstable, the output signals in an unstable state cannot affect the second module 500. This is because the input terminals of the AND gates G3~G6 of the second module 500 are grounded through the pull-down resistor R'. According to the voltage level converting circuit or interface circuit of the second embodiment in the present invention, it is possible to provide a stable signal for the next state even in the power-off mode, as well as preventing the leakage current within the voltage level converting circuit.

Figure 6:
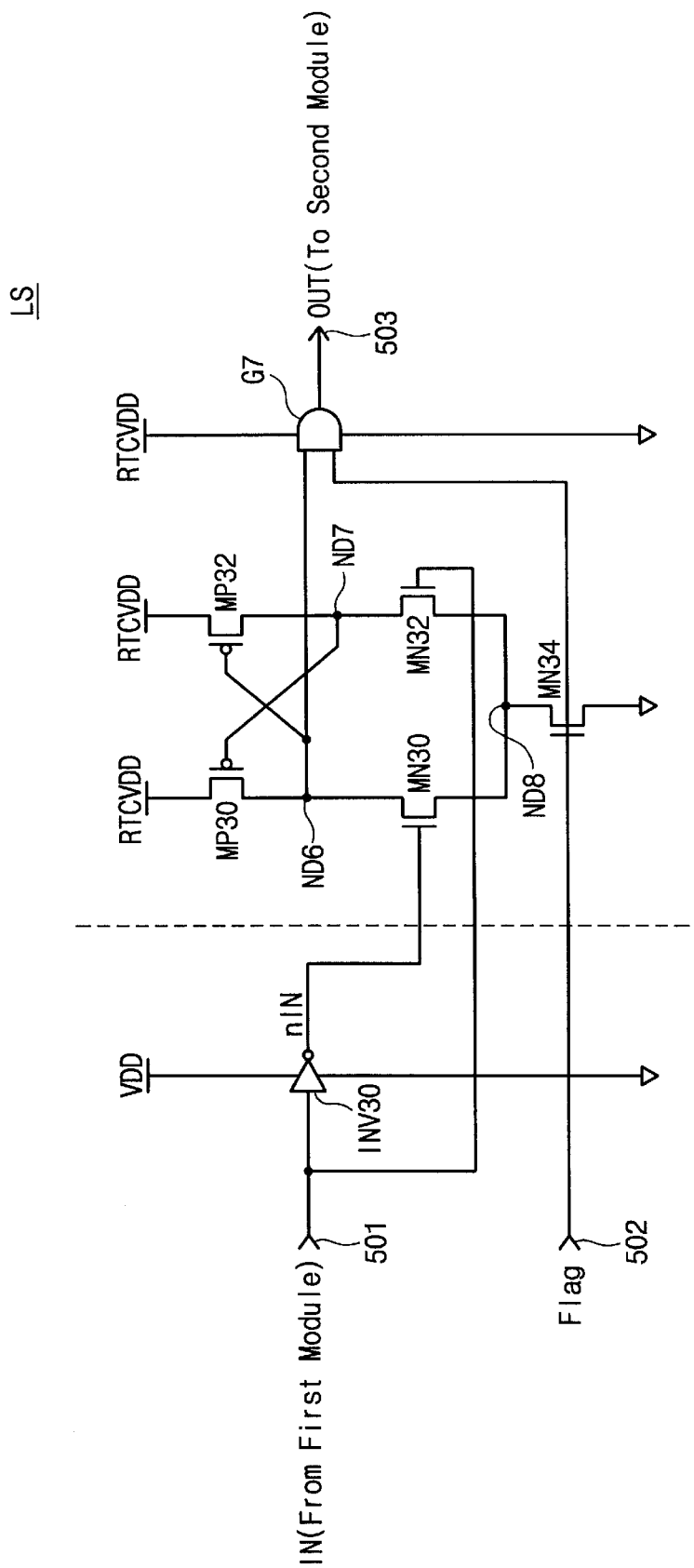
FIG. 6 is a circuit diagram showing another embodiment of the voltage level converting circuit shown in FIG. 2.

FIG. 6 is a circuit diagram showing another embodiment of the voltage level converting circuit of the present invention. The voltage level converting circuit LS shown in FIG. 6 can be applied to the system architecture shown in FIG. 2. Thus, the ground path of the circuit LS is blocked by the, control signal Flag in the power-off mode. As described above, the control signal Flag has a high level in the normal operating mode, and a low level in the power-off mode. The voltage level converting circuit LS is formed of inverter INV30, two PMOS transistors MP30 and MP32, two NMOS transistors MN30, MN32, and MN34, and AND gate G7.

The inverter INV30 is connected to an input terminal 501 receiving the input signal IN form the first module 100, and inverts the input signal IN. The PMOS transistor MP30 has a current path connected between the power supply voltage RTCVDD of the second module 200 and a node ND6, and the PMOS transistor MP32 has a current path connected between the power supply voltage RTCVDD of the second module 200 and a node ND7. Gate electrodes of the PMOS transistors MP30 and MP32 are cross-coupled to the nodes ND6 and ND7.

The NMOS transistor MN30 has a current path formed between the nodes ND6 and ND8, and a gate electrode coupled to the output signal nIN of the inverter INV 30. The NMOS transistor MN32 has a current path formed between the nodes ND7 and ND8, and a gate electrode coupled to the input signal IN. The NMOS transistor MN34 has a current path formed between the node ND8 and the ground voltage, and a gate electrode connected to an input terminal 502 receiving the control signal Flag. The AND gate G7 has input terminals connected to the node ND6 and the input terminal 502, and an output terminal to provide the output signal OUT corresponding to the input signal IN. The inverter INV30 operates in the power supply voltage VDD of the first module 100, and the remaining elements operate in the power supply voltage RTCVDD of the second module 200. The NMOS transistor MN34 serves as a current path cut-off circuit to interrupt the ground path in response to the control signal Flag.

In the normal operating mode, the output terminal EC of the first module 100 has a high level. Briefly, the node ND1 shown in FIG. 2 transitions to a high level. Thus, the control signal Flag transitions to a high level in the normal operating mode. Since the control signal Flag is at a high level, the NMOS transistor NM34 shown in FIG. 6 is turned on, and the output signal of the AND gate G7 is determined by a voltage level of the node ND6. As a result, the voltage level converting circuit LS shown in FIG. 6 operates normally.

When the system having the voltage level converting circuit enters the power-off mode, the output terminal EC of the first module 100 is conducted to be in a floating state, and the node ND1 shown in FIG. 2 is grounded through the pull-down resistor R. The control signal Flag transitions to a low level. At the same time, the power supply voltage VDD of the first module 100 is blocked, so that the input signal IN applied to the input terminal 501 and the output signal nIN of the inverter INV30 are subject to an unstable state. This causes the leakage current to flow within the conventional voltage level converting circuit, and the unstable signal to be supplied for the next stage.

However, because of the control signal Flag at a low level, the NMOS transistor MN34 is turned off, resulting in interruption of the ground path of the NMOS transistors MN30 and MN32. That is, the leakage current path caused by the unstable input signal is completely blocked. Since the control signal Flag is at a low level in the power-off mode, the AND gate G7 generates the stable output signal OUT at a low level without regard to the unstable status of the node ND6. As a result, it is possible to provide the stable signal for the next stage even in the power-off mode, as well as interrupting the leakage current within the voltage level converting circuit.

According to the foregoing description of the present invention, it is possible to prevent the leakage current path of the voltage level converting circuit due to an unstable output signal provided from a module where the power supply voltage is interrupted in the power-off mode.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. An on-chip system comprising:
    a first module being operated at a first power supply voltage, the first power supply voltage to the first module being interrupted in a power-off mode;
    a second module being operated at a second power supply voltage and supplied with the second power supply voltage even in the power-off mode; and
    an interface circuit connected between the first module and the second module, the interface circuit comprising:
        a level converting section having input transistors for converting a voltage level of the first power supply voltage provided to the first module to a voltage level of the second power supply voltage; and
        a means for preventing the input transistors from being activated in response to a control signal when an input signal provided from the first module is unstable in the power-off mode.

2. The on-chip system of claim 1, wherein the control signal is at a high level in a normal operating mode and at a low level in the power-off mode.

3. The on-chip system of claim 2, wherein the control signal is created in a control signal generating circuit comprising an output terminal of the first module and a resistor being connected between the output terminal and ground voltage, and the control signal is provided from a connecting node of the resistor and the output terminal.

4. The on-chip system of claim 3, wherein the output terminal of the first module is at a high level in the normal operating mode, and in a floating status in the power-off mode.

5. The on-chip system of claim 1, wherein the means for preventing the input transistors from being synchronously activated comprises:
 a first inverter for converting a signal provided from the first module;
 a second inverter for converting the control signal;
 an OR gate for providing a gate signal provided from one of the input transistors in response to the output signals from the first and second inverters; and
 a AND gate for providing a gate signal provided from another of the input transistors in response to the control signal and the signal provided from the first module.

6. The on-chip system of the claim 5, wherein the first inverter operates at the first power supply voltage, and the second inverter, the OR gate, and the AND gate operate at the second power supply voltage.

7. A voltage level converting device comprising:
 an input terminal for receiving an input signal of a first power supply voltage;
 a pair of cross-coupled transistors connected to a second supply voltage, a first node, and a second node;
 a first input transistor coupled to the input terminal and connected between the first node and ground voltage;
 a second input transistor connected between the second node and the ground voltage; and
 an input control circuit for preventing the first and second input transistors from being activated by the input signal if the input signal is in an unstable state in response to a control signal applied from the outside, the control signal being at a high level in a normal operating mode and at a low level in a power-off mode, the input control circuit comprising:
  a first inverter for converting the input signal;
  a second inverter for converting the control signal;
  an OR gate for providing a gate signal of the first input transistor in response to output signals of the first and second inverters; and
  an AND gate for providing a gate signal of the second input transistor in response to the input signal and the control signal.

8. The voltage level converting device of claim 7, wherein the first inverter operates at the first power supply voltage, and the second inverter, the OR gate and the AND gate operate at the second power supply voltage.

9. An on-chip system comprising:
 a first module being operated at a first power supply voltage, the first power supply voltage to the first module being interrupted in a power-off mode;
 a second module being operated at a second power supply voltage higher than the first power supply voltage and supplied with the second power supply voltage even in the power-off mode; and
 an interface circuit connected between the first and second modules, wherein the interface circuit comprises:
  a pair of cross-coupled transistors connected to the second power supply voltage, a first node, and a second node;
  first and second input transistors respectively connected between the first node and ground voltage, and the second node and the ground voltage; and
  an input control circuit for activating only the first and second input transistors in response to a control signal applied from the outside when an input signal from the first module is in an unstable state in the power-off mode.

10. The on-chip system of claim 9, wherein the control signal is in a high level in a normal operating mode and in a low level in the power-off mode.

11. The on-chip system of claim 10, wherein the control signal is created in a control signal generating circuit comprising an output terminal of the first module and a resistor connected between the input terminal and the ground voltage, and the control signal is provided from a connecting node of the resistor and the output terminal.

12. The on-chip system of claim 11, wherein the output terminal of the first module is in a high level in the normal mode, and in a floating status in the power-off mode.

13. The on-chip system of claim 9, wherein the input control circuit comprises:
 a first inverter for converting an input signal of the first module;
 a second inverter for converting the control signal;
 an OR gate for providing a gate signal of the first input transistor in response to output signals of the first and second inverters; and
 an AND gate for providing a gate signal of the second input transistor in response to the control signal and the input signal.

14. The on-chip system of claim 13, wherein the first inverter operates at the first power supply voltage, and the second inverter, the OR gate, and the AND gate operate at the second power supply voltage.

15. An on-chip system comprising:
 a first module being operated at a first power supply voltage, the first power supply voltage to the first module being interrupted in a power-off mode;
 a second module being operated at a second power supply voltage higher than the first power supply voltage and supplied with the second power supply voltage even in the power-off mode; and
 a plurality of voltage level converting circuits serially connected between the first and second modules, wherein each of the voltage level converting circuits comprises:
  a pair of cross-coupled transistors connected to the second power supply voltage, a first node, and a second node;
  first and second input transistors respectively connected between the first node and a third node, and the second node and the third node, wherein the first input transistor is controlled by an input signal provided from the first module and the second input transistor is controlled by an inverted signal of the input signal;
  an inverter connected to the first node for providing an output signal corresponding to the input signal; and
  a current path cut-off circuit connected between the third node and ground voltage for interrupting a current path between the third node and the ground voltage when the input signal of the respective level converting circuits is in an unstable state in the power-off mode.

16. The on-chip system of claim 15, wherein the current path cutoff circuit comprises:
 a resistor connected between an output terminal of the first module and the ground voltage; and an N-channel metal oxide semiconductor (NMOS) transistor having a current path connected between the third node and the ground voltage, and a gate coupled to the output terminal of the first module.

17. The on-chip system of claim 16, wherein the output terminal of the first module is at a high level in a normal operating mode and in a floating status in the power-off mode.

18. The on-chip system of claim 16, wherein the second module includes a plurality of AND gates corresponding to the voltage level converting circuits, each of the AND gates having a first input terminal receiving an output signal of the voltage level converting circuit corresponding thereto, and a second output terminal connected to the output terminal of the first module.

19. An on-chip system comprising:
   a first module being operated at a first power supply voltage, the first power supply voltage to the first module being interrupted in a power-off mode;
   a second module being operated at a second power supply voltage higher than the first power supply voltage and supplied with the second power supply voltage even in the power-off mode; and
   a voltage level converting circuit connected between the first and second modules, wherein the voltage level converting circuit comprises:
      a pair of cross-coupled transistors connected to the second power supply voltage, a first node, and a second node;
      first and second input transistors respectively connected between the first node and a third node, and the second node and the third node, wherein the first input transistor is controlled by an input signal provided from the first module and the second input transistor is controlled by an inverted signal of the input signal;
      an AND gate receiving a signal from the first node and control signal from the outside, and providing an output signal corresponding to the input signal; and
      a current path cut-off circuit connected between the third node and ground voltage for interrupting a current path between the third node and the ground voltage when the input signal of the respective level converting circuits is in an unstable state in the power-off mode.

20. The on-chip system of claim 19, wherein the current path cutoff circuit comprises an NMOS transistor having a current path connected between the third node and the ground voltage, and a gate coupled to the control signal.

21. The on-chip system of claim 20, wherein the control signal is at a high level in the normal operating mode and at a low level in the power-off mode.

22. The on-chip system of claim 21, wherein the control signal is created in a control signal generating circuit comprising an output terminal of the first module and a resistor connected between the output terminal of the first module and ground voltage, and the control signal is provided from a connecting node of the resistor and the output terminal.

* * * * *